United States Patent
Newman

(10) Patent No.: US 8,954,334 B2
(45) Date of Patent: Feb. 10, 2015

(54) VOICE-ACTIVATED PULSER

(75) Inventor: David Edward Newman, Temecula, CA (US)

(73) Assignee: Zanavox, Temecula, CA (US)

( * ) Notice: Subject to any disclaimer, the term of this patent is extended or adjusted under 35 U.S.C. 154(b) by 761 days.

(21) Appl. No.: 13/274,322

(22) Filed: Oct. 15, 2011

(65) Prior Publication Data

US 2013/0093445 A1    Apr. 18, 2013

(51) Int. Cl.
| | |
|---|---|
| *G10L 21/00* | (2013.01) |
| *G10L 21/06* | (2013.01) |
| *G01R 13/32* | (2006.01) |
| *G01R 13/02* | (2006.01) |
| *G10L 15/26* | (2006.01) |
| *G10L 15/22* | (2006.01) |

(52) U.S. Cl.
CPC ............ *G01R 13/32* (2013.01); *G01R 13/0254* (2013.01); *G10L 15/265* (2013.01); *G10L 2015/223* (2013.01)
USPC ........ 704/275; 704/271; 704/270.1; 704/270; 704/251; 704/231

(58) Field of Classification Search
CPC . G10L 15/265; G10L 2015/223; G10L 21/18; G10L 15/22; G10L 17/005; G10L 15/00; G10L 15/26; G10L 15/30; G10L 15/005; G10L 15/10; G10L 15/28; G10L 2015/228; G10L 21/00; H04M 1/6041; H04M 1/271; H04M 1/72533; A41D 1/002
USPC ...................... 704/275, 270, 231, 251, 270.1, 704/E21.001, E15.001, E15.045, E15.44; 324/750.3; 450/419; 455/569.1
See application file for complete search history.

(56) References Cited

U.S. PATENT DOCUMENTS

| | | | | |
|---|---|---|---|---|
| 4,717,364 | A * | 1/1988 | Furukawa ...................... 446/175 |
| 5,792,204 | A * | 8/1998 | Snell ................................ 607/32 |
| 5,890,122 | A * | 3/1999 | Van Kleeck et al. .......... 704/275 |
| 5,890,123 | A * | 3/1999 | Brown et al. ............... 704/270.1 |
| 6,137,830 | A * | 10/2000 | Schneider et al. ............ 375/224 |
| 6,188,985 | B1 * | 2/2001 | Thrift et al. .................... 704/275 |
| 6,339,706 | B1 * | 1/2002 | Tillgren et al. ............... 455/419 |
| 7,027,991 | B2 | 4/2006 | Alexander |
| 7,769,412 | B1 * | 8/2010 | Gailloux .................... 455/569.1 |

(Continued)

OTHER PUBLICATIONS

Su et al. "Voice-controlled human-computer interface for the disabled", Computing & Control Engineering Journal, vol. 12, Issue 5, Oct. 2001, p. 225-230.*

(Continued)

*Primary Examiner* — Abdelali Serrou

(57) ABSTRACT

A voice-activated pulser can trigger an oscilloscope or a meter, upon a simple voice command, thereby enabling hands-free signal measurements. The pulser can also be used to control the circuit under test, activating it or changing parameters, all under voice control. The pulser includes numerous switch-selectable output modes that allow users to generate complex, tightly-controlled diagnostic sequences, all activated upon a voice command and hands-free. The invention includes a fast, robust command-interpretation protocol that completely eliminates the expense and complexity of word recognition. Visual indicators display the device status and various operating modes, and also confirm each output pulse. The device receives voice commands directly through an internal microphone, or through a detachable headset, and confirms each command with an acoustical signal in the headset.

12 Claims, 6 Drawing Sheets

(56) References Cited

U.S. PATENT DOCUMENTS

| | | | |
|---|---|---|---|
| 8,320,824 B2* | 11/2012 | Banks et al. | 455/3.06 |
| 8,688,459 B2* | 4/2014 | Nenov et al. | 704/275 |
| 2002/0103651 A1* | 8/2002 | Alexander et al. | 704/275 |
| 2002/0178009 A1* | 11/2002 | Firman | 704/275 |
| 2004/0181415 A1* | 9/2004 | Krol et al. | 704/275 |
| 2005/0259834 A1* | 11/2005 | Ariav | 381/110 |
| 2007/0233499 A1* | 10/2007 | Yudkovitch et al. | 704/275 |
| 2008/0021711 A1* | 1/2008 | Claus et al. | 704/275 |
| 2009/0010456 A1* | 1/2009 | Goldstein et al. | 381/110 |
| 2010/0069723 A1* | 3/2010 | Islam | 600/300 |

OTHER PUBLICATIONS

Lisa J. Stifelman, "a speech interface for a hand-held voice notetaker", Proceeding CHI '93 Proceedings of the INTERACT '93 and CHI '93 Conference on Human Factors in Computing Systems, pp. 179-186.*

* cited by examiner

VOICE-ACTIVATED PULSER

BACKGROUND OF THE INVENTION

The invention relates to voice-activated devices, and particularly to devices for generating electronic signals responsive to voice commands.

A variety of new voice-activated products have appeared recently, ranging from the sublime (in-car GPS, phone dialers, computer dictation) to the ridiculous (voice-activated t-shirts, coffee pots, light-sabers). The most practical near-term application for voice-activation technology is for hands-free triggering of electronic instruments such as oscilloscopes and meters. Oddly, this has received almost no attention.

Everyone with experience in electronic testing knows how hard it is to trigger a scope while holding multiple probes against specific locations on the circuit under test. Fine-pitch parts don't make this any easier. Sometimes it is sufficient to free-run the scope or use some other signal as a trigger, but in many cases the engineer needs to trigger the measurement directly, at a particular time. for other measurements, it is necessary to activate or modulate the circuit under test, for example to compare waveforms under two different conditions. Most engineers have only two hands and therefore cannot trigger the scope manually or activate the circuit under test, while holding multiple probes in position (although some have been known to trigger the scope with a toe.)

A single patent (U.S. Pat. No. 7,027,991) partially mitigates this problem with an oscilloscope that can be controlled by voice commands. This is a step in the right direction, but it fails to exploit the versatility of voice-activation technology in several aspects. First, the prior-art scope trigger is usable only for the instrument that contains it, whereas a truly versatile stand-alone device should be able to trigger a wide range of voltage-measurement instruments simply by connecting with a cable. Second, the prior-art systems are not able to activate the circuit under test, because there is no provision for a voice-responsive output signal. Third, the prior-art systems provide no external indication as to when the system is available or inhibited (ie, deadtime, busy, etc.). Fourth, the prior-art systems have no way to alternate a state condition on the circuit under test, which is an extremely useful technique for diagnosing operational problems.

Given the advantages of voice-activation of instruments, why is it not widely available? The answer is that all voice-activated measurement systems employ full word recognition algorithms, resulting in extremely high cost and complexity, complex software, often a cumbersome "training" period, and lack of speaker universality. And still they have an annoying delay between the command and the pulse. To take one example: a commercial dictation routine, although costly, works pretty well—on a $2500 machine with a fast multi-core processor and gobs of cache, and after 60 minutes of tedious training. Seriously, if you only want to trigger a scope, word-recognition is overkill.

What is needed is a low-cost, easy to use, extremely versatile device to generate an output signal, capable of triggering an oscilloscope as well as a circuit under test, all upon one or two simple voice commands. Preferably the device includes multiple operational modes and multiple outputs so that the user can select the mode and output for each type of measurement. Even more preferably, the device would involve no training, no software installation, no special adaptors, no anything else; just connect the device to the scope and trigger it. Such a device will simplify innumerable measurement tasks, thereby earning the heartfelt appreciation of electronic test engineers everywhere.

BRIEF SUMMARY OF THE INVENTION

The invention is a device and a method to generate an output signal, responsive to a simple voice command, to activate a triggerable electronic system such as an oscilloscope or a circuit under test. The device can cause the circuit under test to produce a responsive diagnostic voltage, which is then measured by a measurement instrument, thereby allowing a user to diagnose a problem with the test circuit. Or, the device can cause a triggerable measurement instrument, such as a meter or oscilloscope, to perform the measurement when so activated. In both configurations, the invention simplifies the task by allowing the user to control the timing and character of the measurements, easily and hands-free.

The invention involves several different signals and voltages, which can get confusing. For clarity, each type of signal or voltage will be identified specifically by name. An "output signal" is an electronic transmission, such as a pulse, emitted by the inventive device upon a voice command. The invention may generate multiple distinct output signals upon different commands, the output signals being termed a "type-1 output signal", a "type-2 output signal", and so forth. The invention may also generate a "readiness signal" indicating whether the invention is inhibited or is ready to receive voice commands. A "microphone signal" is a low-level electronic signal coming directly from a microphone, and an "amplified signal" is the raw signal after amplification and optional filtering. A "threshold voltage" is a voltage against which the amplified signals are compared to detect the sound of a spoken command. A "diagnostic voltage" is a voltage or series of voltages generated by the circuit under test, and which the measurement instrument measures.

The voice command comprises any utterance produced by the user with intent to activate the triggerable system. In the simplest version, the invention responds to every command by generating the same output signal; the user simply says "Go" and gets one pulse. Or, for greater versatility, the inventive device may generate a variety of different output signals responsive to different commands. Preferably the device uses a robust and universal command recognition protocol readily implemented in a low-cost microcontroller, such as syllable-counting. In the syllable-counting protocol, the invention counts the number of command syllables by detecting a brief interval of relative silence between the syllable sounds. It then generates a type-1 output signal for a single-syllable command, a type-2 output signal for a double-syllable command, and so forth. The invention produces a type-1 output signal when the user says a single-syllable command such as "Go", and a type-2 output signal when the user says a double-syllable command such as "Reset". The invention may additionally respond to three-syllable commands with a type-3 output. The syllable-counting protocol is easy and intuitive for users, yet is versatile enough for an unlimited range of measurements.

The inventive output signals are any electronic transmissions from the inventive device. Usually the output signals comprise either a brief voltage pulse or an alternating voltage level that alternates upon each voice command. The output signals may comprise a voltage that increases stepwise upon each separate syllable of the command, rising to 1 volt upon the first syllable, then 2 volts upon the second syllable, then 3 volts if there it a third syllable, and then returning to zero volts at the end of the command-processing routine. As a further alternative, the output signals may be digital communication messages such as USB signals, that activate a computer-based measurement instrument such as a PC-oscilloscope and the like. The various distinct output signals (type-1, type-2, etc)

are usually provided on separate conductors. Alternatively, the output signals may share a single conductor if the various output signals are distinct. For example a type-1 signal may be a positive pulse, and a type-2 signal may be a negative pulse, both appearing on the same conductor at different times. Or, the output signals may comprise frequency modulation, pulse width modulation, analog voltage patterns, complex digital messages, different currents, and different impedances, presented on separate or shared conductors.

The inventive device is detachably connected to the triggerable electronic system, using connectors and a cable or wire or other conductor, so that the output signal can activate it. The triggerable system comprises any electronics responding to the output signal, including a measurement instrument or a circuit under test. A measurement instrument is any means for measuring a diagnostic voltage, or a series of voltages, on the circuit under test. Such instruments include oscilloscopes and logic analyzers and spectrum analyzers and multichannel analyzers and computer-based measurement systems, and any other instruments that measure a series of voltages over time. The measurement instrument may also be a sample-and-hold meter that measures a single voltage when so triggered. Such a meter may measure a voltage per se, or it may measure a voltage value that is related to some other quantity such as a current or a temperature or an electromagnetic field or a light intensity for example. Importantly, the invention is not restricted to a particular measurement instrument, but allows the user to trigger virtually any instrument simply by connecting the invention to it and issuing a voice command.

The triggerable system may also be the circuit under test, when the output signal is connected to the circuit under test so as to control or activate it. The circuit under test is any electronic circuit being measured by the user, including circuit boards, discrete devices, complete systems, and networks as well as communication lines between them, so long as the output signal triggers or otherwise activates the circuit. Normally the circuit under test responsively generates a diagnostic voltage or a series of diagnostic voltages, which a measurement instrument subsequently measures for the purpose of revealing something about the circuit under test. The measurement instrument may be free-running, or triggered by a change in the diagnostic voltage, or triggered by the same output signal or a different output signal from the inventive device. The output signal can enable or disable a function of the circuit under test, or alternate a circuit condition, or prompt the test circuit to generate a pulse or a digital communication message, as well as many other operations that will occur to test engineers when they use this invention. Importantly, the invention is not restricted to a particular test circuit, but allows the user to activate virtually any circuit simply by connecting the invention to it and issuing a voice command.

The invention includes means for detecting voice commands and discriminating them from background noise, typically including a microphone, amplifiers, filters, and a processor. The microphone converts sound to an electronic raw signal, from which the amplifiers and filters then produce an amplified signal, which the processor compares to a predetermined threshold value. The invention may include rectifying and smoothing to further separate command sounds from background noise. The invention determines that a sound is detected when the amplified signal (with or without rectification) exceeds the threshold, and no sound is detected when the amplified signal remains below the threshold. Preferably the invention selects a frequency band corresponding to the human voice, and suppresses sounds outside that frequency band.

The invention may include manual or automatic adjustment means for adjusting the acoustical sensitivity to mitigate a varying level of background noise. For example, the invention may derive an average noise value by monitoring the amplified signals, and then increase or decrease a threshold value accordingly. Preferably the invention suppresses this process while a command sound is detected, to avoid unduly biasing the adjustment. Or, the invention may include manual adjustment means for varying the sensitivity. The manual control may be a potentiometer that attenuates the microphone signal, or varies the gain of the amplifier, or varies a DC level that a digital processor then uses as a threshold level. Other means for varying the sensitivity will be apparent to many.

The invention may discriminate single-syllable commands from multi-syllable commands. To do so, the invention may emphasize the voiced command sounds such as vowels, while suppressing unvoiced consonant sounds. For example the "s" in "Reset" has higher frequencies and lower sound amplitude than the vowel sounds. The invention exploits this by filtering out the high frequency sounds and amplifying the voiced vowel sounds. "Reset" is thus recognized as having two voiced periods separated by a brief gap of substantially less voiced sound, comprising a double-sound or double-syllable command. In contrast, "Go" has only one uninterrupted period of voiced sound, and thus would be interpreted as a single-sound command. The invention may detect commands with three syllables in a similar way.

The invention may impose deadtime periods, of duration Td for example, during which all sounds are ignored. The deadtime may be simply a fixed waiting period. Or, much more preferably, the deadtime is retriggerable in that if any sound is detected during Td, then the Td period is started over, and it continues to do so until a full Td period expires with no further sound detected therein. The deadtime may be imposed before accepting any command sound, thereby assuring that prior commands have finished; or the deadtime may be imposed at the end of a command, thereby assuring that the current command is finished before accepting any further commands. Such pre- and post-deadtimes are operationally equivalent after the first instance.

The invention may analyze commands by marking a series of time periods. After a deadtime period, the invention then waits until a command sound is detected. It then determines when the first syllable is finished by waiting until there is no additional sound during a short interval Ta. Ta is chosen to be shorter than the non-voiced interval between syllables, in most two-syllable words. Then, after the first syllable is finished, the protocol waits for a longer period Tg, during which it listens for a second syllable in the command. Tg is chosen to be long enough to catch the second syllable of most command words. If no sound occurs during Tg, then the command is a single-sound command. If a second sound occurs during Tg, then it is a double-sound command. To detect a three-sound command, the Ta-Tg sequence is repeated. To summarize, the syllable-counting sequence is: (wait for deadtime Td)-(wait for first sound)-(wait for end of first syllable)-(listen for second sound during Tg)-(generate output signal).

In practice, people easily use one- and two-sound commands, or three-sound commands with care. Commands with four or more syllables will work, but they tend to become unwieldy. Td should be chosen long enough to ensure that prior commands have finished, but not so long that the system becomes balky. Typically Td is 100 to 500 msec (milliseconds). Ta must be shorter than the unvoiced interval between syllable sounds, but long enough to ensure that the first syllable is finished. Typically Ta is 20 to 200 msec. Tg is long enough to catch the second syllable sound, but not so long that the next command is mistakenly counted as a double-sound command. Typically Tg is 100 to 1000 msec.

The invention may also measure the duration of each syllable sound by starting a timer when the first sound begins, then stopping the timer after the Ta period, and optionally subtracting Ta to get the actual sound duration time. Typically the duration of a syllable is about 50 to 500 msec. The invention may exclude background noises that have a duration outside than this range.

Often it is desirable to lock the device temporarily, for example to avoid triggering on noise or to freeze a display. Therefore the invention may include a holding mode, and means for turning the holding mode on and off. In the holding mode, the invention ignores all voice commands and inhibits all outputs, thereby locking a previously-obtained display or measurement.

The invention may include a readiness indicator that depends on whether the invention is ready to receive a voice command. The invention is not ready to receive a voice command when it is inhibited due to a deadtime or holding mode for example. The readiness indicator shows the user when to issue voice commands. The invention may also generate a readiness output signal, which could be used to gate the circuit under test or to trigger an oscilloscope for example.

The invention may include a battery for power, and may include an indicator to alert the user when the battery voltage is getting low. Or, the invention may include an internal or external power supply. Or, when the invention is connected to a computer-based measurement system by a digital communication cable such as a USB cable, the invention may draw power from it.

The invention may include an internal microphone or a detachable external microphone using an audio plug, for example. The external microphone may include a wireless link including a radio or optical transmission. Whenever the external microphone is plugged in, the internal microphone may be automatically disconnected to avoid interference. The external microphone may be a bench-type microphone, or a computer-based microphone, or a wearable microphone. Wearable microphones tend to have better signal properties than internal microphones, since a wearable microphone is generally closer to the user and tends to be less susceptible to background noises. A wearable microphone may also include a speaker, as in a headset. The invention may generate an acoustical command-validation signal, such as a tone, in the wearable speaker when each output signal is generated. Preferably the invention generates a different tone for a single- and double-syllable command. Such a tone informs the user when each voice command is accepted, and also informs the operator immediately if a command has been misinterpreted, or if the device triggers on background noise.

The invention may include visual indicators, such as LED's, showing various operational states of the device. The indicators may flash whenever an output signal is generated, preferably with distinct indicators for type-1 and type-2 output signals. The invention may communicate its operational state to a computer for display or storage.

Structurally, the inventive device comprises a microphone, a circuit board, an enclosure, and one or more output connectors carrying the output signals. The circuit board includes amplifiers (including optional filters and rectifiers) to amplify the raw signals from the microphone, and processing means to detect command sounds by comparing the amplified signals to a predetermined voltage threshold. The processing means also measures time intervals such as deadtime intervals, and generates the output signals. The enclosure encloses the circuit board and supports the output connectors. The output connectors may be coaxial such as BNC and SMA jacks, or single-conductor connectors such as banana jacks or screw terminals, or digital communication connectors such as USB jacks for example. Typically the enclosure includes a battery, an on-off switch admitting power from the battery to the circuit board, an indicator indicating when the system is ready to receive voice commands, an indicator indicating when the output signal is generated, a jack for connecting an external microphone, and a sensitivity control.

The invention is also a method, to activate a triggerable electronic system comprising a measurement instrument or a circuit under test, responsive to a spoken command. The inventive method discriminates commands from ambient noise on the basis of amplitude and frequency and timing. The method includes the steps of connecting the invention to the measurement instrument or to the circuit under test; then detecting the command sounds by amplifying the raw signals from a microphone, a sound being detected when the amplified signals exceed a threshold value; and then generating an electronic output signal which then activates the triggerable electronic system. The output signal either causes the measurement instrument to measure a diagnostic voltage on the circuit under test, or the output signal causes the circuit under test to produce a diagnostic voltage, which the measurement instrument subsequently measures. Or, the circuit under test and the measurement instrument may both be triggered by the same output signal or by different output signals at different times.

Frequency discrimination may be achieved with analog filters or by digital analysis of the sound signal, preferably accepting sounds with frequencies in a bandwidth corresponding to the voiced syllables, while rejecting frequencies above or below that band. Amplitude discrimination may be achieved by comparing the amplified signal to a single threshold value; or, since sound waves have both positive and negative fluctuations, comparing the amplified signal to two threshold values corresponding to positive and negative variations relative to a mean. As a further alternative, the sound may be rectified and optionally smoothed, and then the rectified signal may be compared to a threshold. The step of amplifying includes optional filtering, rectifying, and smoothing. The step of comparing includes comparing both positive and negative variations with their respective threshold values.

The inventive method may include waiting for a deadtime period Td of relative silence, to ensure that any prior commands have completed, and to avoid multiple-triggering. The Td period may be imposed before accepting any commands, or after each detected sound.

The inventive method may include counting the number of separate voiced sounds in the spoken command, and generating different output signals responsive to commands with different numbers of voiced sounds. The method then includes a step of detecting the end of the first voiced sound by waiting until an interval Ta expires with no further sound detected therein. Thus the first Ta period of silence, following a command sound, indicates that the first syllable is finished. Then, after the Ta period, the invention waits an additional Tg period to see if a second syllable arrives. The invention generates a type-1 signal for a single-sound command if no further sound is detected during Tg, and generates a type-2 signal for a double-sound command if any sound is detected during Tg. The method may also include waiting additional Ta-Tg periods, to identify commands with three or more voiced syllables, and generating the appropriate output signal for each.

The method may include measuring the duration of each detected syllable sound, and rejecting the command if the duration is outside a predetermined range. Likewise the command may be rejected if any portion of the sound exceeds a maximum expected level, or if the two syllables of a type-2 command are have very different sound levels or very different frequency ranges. These steps allow the invention to avoid responding to certain background noises.

The step of generating the output signal may comprise generating a brief output pulse upon a voice command, or generating an output voltage that alternates between two voltage values upon each command, or generating a voltage that increases, stepwise, upon each successive syllable until the command is finished. Or the output signal may involve other electronic transmissions including amplitude and frequency modulation, and digital communication messages such as USB messages.

The method may include setting a readiness parameter according to whether voice commands are inhibited or enabled. For example, the readiness parameter is turned on after the Td deadtime is expired, and the readiness parameter is turned off when a holding mode has been set. The method may include generating a readiness output signal comprising a first voltage level when voice commands can be received, and a second voltage level when voice commands are inhibited. The method may also include activating an indicator based on the readiness parameter, thereby showing the user when a voice command can be accepted.

The method includes a protocol to determine the timing of the output signals. In one protocol, termed the immediate-output protocol, each output signal is generated immediately upon detecting each syllable sound of the command. This provides the best responsiveness, but unavoidably generates multiple output signals upon multi-syllable commands. That is because there is no way to know, at the start of a command, whether it will have one or two or three syllables. In the immediate-output mode, a type-1 signal is generated immediately upon the first syllable of every command. If there is a second syllable, then it generates a type-2 signal immediately upon the second syllable sound, followed by a type-3 signal for a three-syllable command. This rapid multi-pulse output sequence is useful in some measurement situations, for example to initiate a rapid sequence and then to measure a response.

In some situations, however, the user wants only a single output signal that correctly matches the command type. Therefore the method may include a delayed-output protocol in which the output signal is generated only after the command is finished. The delayed-output protocol ensures that the number of voiced periods in the command will be determined first, and then the correct output signal is generated. The delayed-output protocol includes performing the Ta-Tg waiting intervals first, and then generating the appropriate output signal only after Tg expires. Thus in the delayed-output protocol, only one output signal is generated, and it corresponds correctly to the command. However, the delayed-output protocol necessarily involves a perceptible trigger hesitation while the period Tg expires.

The inventive method may include a third protocol, termed the regulated-output protocol, which provides a prompt response (as in the immediate mode) but eliminates multiple pulsing (like the delayed mode). The regulated-output protocol includes a regulator parameter that can be set to enable and disable the type-1 outputs. The regulator parameter is set to the enabling state after each double-syllable command, and becomes disabling after each single-syllable command. When the parameter is enabling, the invention generates a type-1 signal as soon as any command is detected, and then the parameter is disabled to prevent any further type-1 output signals. Then, upon the next double-syllable command, the parameter is re-enabled. Thus, a double-syllable command resets the regulator parameter, and then a single-syllable command generates an immediate type-1 output signal. The net effect is to generate only one output signal, according to the command type, but without a processing delay.

The user employs the regulated-output protocol by alternately speaking single- and double-syllable commands, such as "Go . . . Reset . . . Go . . . Reset". The regulator parameter is enabled upon each double-syllable command, and is disabled upon each single-syllable command. The user obtains one output signal at a time, of the correct type, immediately upon the first sound of the syllable corresponding to the command type. If the user issues a series of single-syllable commands in a row, such as "Go . . . Go . . . Go", then only the first command generates an output signal, and the subsequent commands are ignored because at that time the regulator parameter has not yet been re-enabled.

The regulated-output protocol has another useful feature in which the user may obtain multiple output pulses when needed. To do so, the user speaks sequential two-syllable commands such as "Reset . . . Reset . . . Reset". Since each of these commands has two syllables, it re-enables the regulator parameter each time. Therefore, a type-1 output is generated upon the first syllable of the next "Reset" command, followed rapidly by a type-2 output upon the second syllable. The advantage of the regulated-output protocol, is that the user can obtain single pulses or multi-pulses at will, and control both the timing and the pulse types for any particular measurement task, simply by speaking single- or double-syllable commands.

Among the many advantages of the syllable-counting protocol are low cost and ease of use. Command interpretation is independent of the language or accent or gender or intonation of the speaker. It does not matter what words the speaker uses, so long as the words have either one voiced sound period, or two voiced sound periods separated by a brief gap. While word recognition requires a full-performance computer with complex software, the inventive protocol can be implemented with a tiny microcontroller costing, literally, pennies (MC9RS08 KB2CSC, 48¢ in 100's from Digikey).

DETAILED DESCRIPTION OF INVENTION

Figure 1:
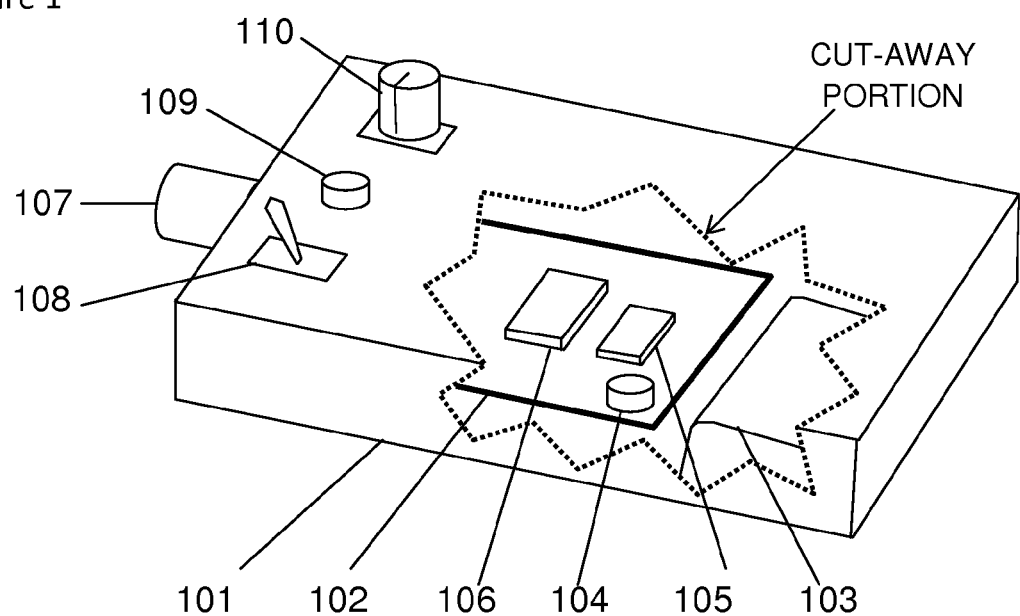
FIG. 1 shows an embodiment, partially cut-away, of the inventive device configured to generate a single pulse output.

Referring to FIG. 1, an embodiment of the invention comprises a case 101 enclosing a circuit board 102 and a battery 103. The case 101 is shown partially cut-away as indicated by a dotted line. The circuit board 102 includes a built-in microphone 104, an amplifier 105, and a processor 106. The case 101 includes an output connector 107, an on-off switch 108, an indicator 109, and a sensitivity adjustment 110.

The microphone 104 is a small electret transducer that converts sound waves of a command into raw electrical signals. (Sound waves readily pass readily through the case 101.) The raw signals are amplified and filtered by the amplifier 105 and then passed to the processor 106. The processor 106 compares the amplified signals to a threshold voltage and generates the output signal when the amplified signals exceed the threshold. The processor 106 also measures time intervals such as deadtime intervals. The output signal then passes through the output connector 107 which is a BNC jack.

The amplifier 105 may comprise discrete components such as transistors, integrated circuits such as op-amps, or a sound detection package such as the MC2830, so long as the gain is sufficient to allow command recognition. The amplifier 105 includes bandpass filters comprising capacitors to exclude signals outside a vocal frequency band of 100 Hz to 700 Hz. Optionally the amplifier 105 includes a rectifier to rectify the amplified signals, and a filter to smooth the rectified signals.

The processor 106 may comprise a voltage comparator such as a LM339 to compare the amplified signals to a threshold voltage, and a pulse generator such as one side of a 74123 monostable oscillator to form an output signal pulse. The other side of the '123 could be configured to demark a deadtime following each output pulse (the retriggerable feature is particularly useful in updating the deadtime interval). The output signal may be a short pulse or a voltage that alternates between two voltage levels (such as +5V and ground) upon each voice command. If the output signal is selected to be an alternating voltage level, then the processor 106 includes a flip-flop such as the 74109 connected to the output of the voltage comparator to produce an alternating high-low output upon each successive voice command. (CMOS may be used instead of TTL if desired.) The processor 106 may include means for converting the output signal to a lower impedance such as a 50Ω line driver, or an emitter follower, or a transformer.

Alternatively, and more tidily, the processor 106 may comprise a microcontroller such as the PIC12F675. The amplified signals can be tested using the voltage comparator of the microcontroller, or digitized by the built-in ADC and then compared to a numerical threshold value. In either case, the microcontroller then generates the output signal, comprising a pulse or an alternating output voltage or digital message as desired. The processor 106 then illuminates the indicator 109, and also demarks any deadtime periods. When the output signal is a digital communication message, the processor 106 preferably includes a built-in communication port such as a UART, USB, I²C, SPI, etc.

The on-off switch 108 is a SPST toggle switch that admits power from the battery 103 to the circuit board 102. The sensitivity adjustment 110 is a potentiometer configured to vary the gain of the amplifier 105. The indicator 109 is an LED connected to the processor 106 to indicate an operational state of the invention. When the device is ready to receive voice commands, the indicator 109 is illuminated green. When the output signal is then generated, the indicator 109 emits a yellow flash. When the system is in a holding mode or otherwise is inhibited from receiving voice commands, the indicator 109 is illuminated red. When the battery 103 is getting low, the indicator 109 flashes red.

Figure 2:
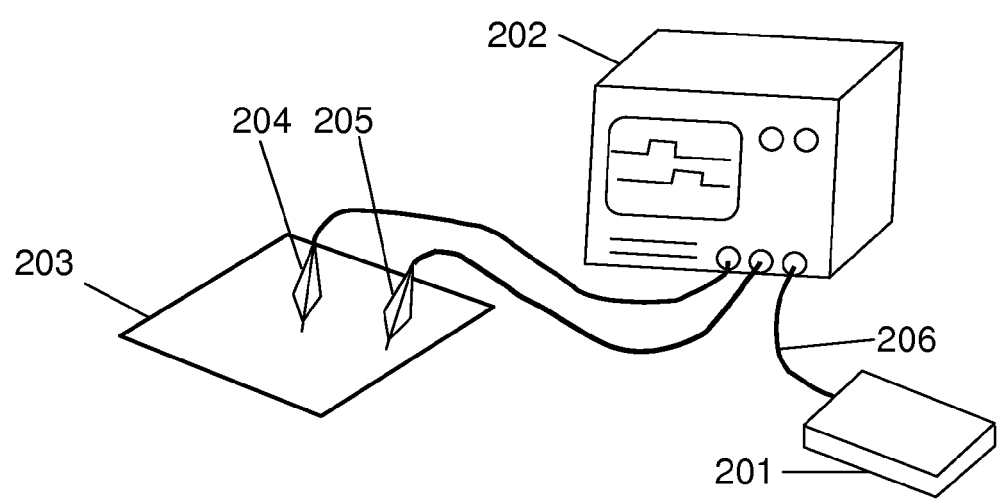
FIG. 2 shows the device in a test set-up to trigger an oscilloscope.

Referring to FIG. 2, the invention 201 may be employed to trigger an oscilloscope 202 which uses two probes 204 and 205 to measure voltages on certain locations of the circuit under test 203. A cable 206 connects the invention 201 to the oscilloscope 202.

The user first arranges the probes 204 and 205 to measure diagnostic voltages at particular locations on the circuit under test 203. Obviously the user cannot activate the oscilloscope 202 while holding the probes 204 and 205 in place. Therefore the user issues a voice command such as "Go", which causes the invention 201 to generate an output pulse, which travels along the cable 206 and triggers the oscilloscope 202. The oscilloscope 202 then performs a series of voltage measurements using the probes 204 and 205. The hands-free triggering enables the user to quickly and easily take the data, thereby figuring out what's wrong with the circuit under test 203.

Figure 3:
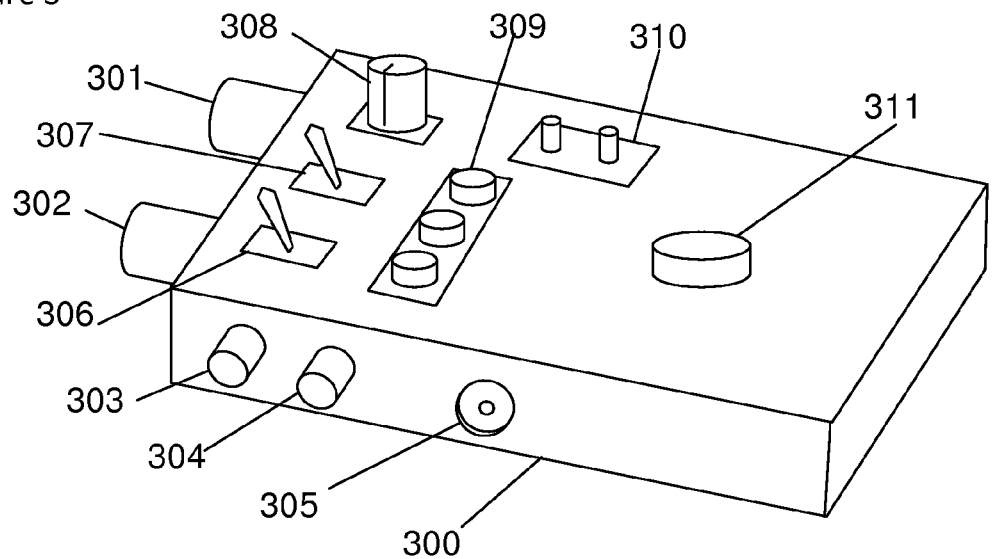
FIG. 3 shows an embodiment for generating multiple outputs with multiple operating modes.

FIG. 3 shows an alternative embodiment having multiple outputs and various modes. The case 300 includes a type-1 output connector 301 which carries type-1 output signals responsive to single-syllable commands, and a type-2 output connector 302 which carries type-2 output signals responsive to double-syllable commands. The embodiment also has a readiness output connector 303 which is a SMA jack carrying a readiness output signal. The embodiment also has an alternating-output connector 304 which is another SMA jack carrying an output signal that alternates between two voltage levels upon each voice command.

The audio jack 305 is a 2.5 mm or 3.5 mm, 2-conductor or 3-conductor jack into which an external microphone (not shown) may be connected. The audio jack 305 also provides power to the external microphone. An on-off switch 306 turns the system power son and off. A mode switch 307 is a 3-position toggle switch to select the output timing mode as immediate-output, delayed-output, or regulated-output. A sensitivity control 308 is a potentiometer wired to generate a variable DC level which is then used as a threshold level.

A set of indicators 309 are LED's that illuminate when the type-1 or type-2 output signals are generated, or when the system is ready to receive a command, or when the alternating-output signal is high or low. The embodiment also has a set of force-trigger buttons 310, which are tactile-type pushbutton switches that force the processor to generate type-1 or type-2 output signals when pressed, even during a holding mode or when otherwise inhibited. Such a capability is useful for debugging a setup.

A hold-run switch 311 is a pushbutton switch that alternately turns the holding mode on and off when pressed. Voice commands are inhibited in holding mode.

Figure 4:
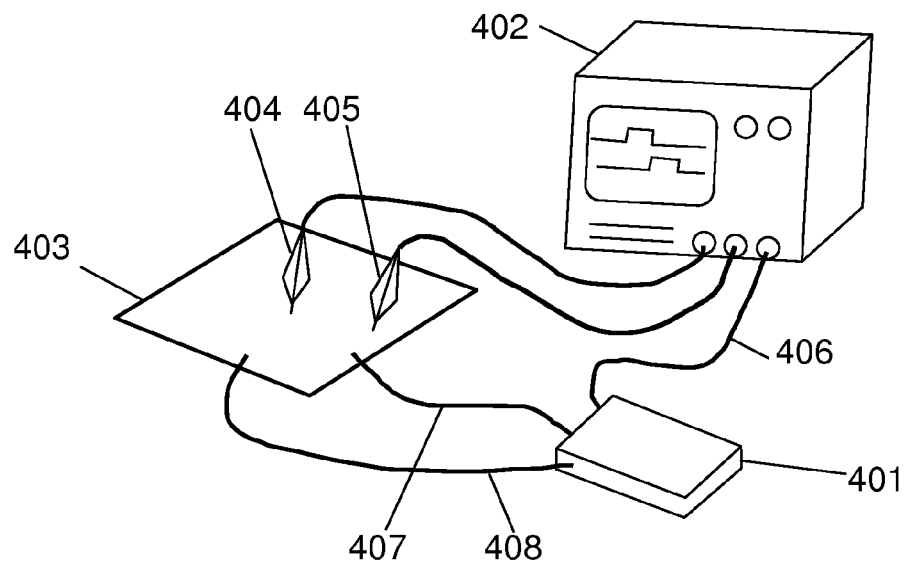
FIG. 4 shows a multiple-output device in a test set-up to activate a circuit under test and also trigger an oscilloscope.

FIG. 4 shows a test set-up using a multi-output embodiment of the invention 401. The invention 401 activates both an oscilloscope 402 and a circuit under test 403, while the oscilloscope 402 measures diagnostic voltages from the circuit under test 403 using the probes 404 and 405. A cable 406 connects the invention 401 to the oscilloscope 402, while two other cables 407 and 408 connect the invention 401 to the circuit under test 403.

The set-up of FIG. 4 supports a very wide range of measurements depending on the timing and output modes selected. To illustrate one example, the regulated-output protocol has been selected, the type-1 output is an alternating voltage level that controls an operational state on the circuit under test 403, and the type-2 output is a pulse that activates a response from the circuit under test 403, and the readiness output is used to trigger the oscilloscope 402. After connecting up the cables and positioning the probes, the user issues a double-syllable command. Upon the command sound, the readiness output immediately goes low, and passes through cable 406, and triggers the oscilloscope 402 on a slow trace.

Then the type-2 output pulse, from the same command, passes through cable 407 and prompts the circuit under test 403 to produce a diagnostic voltage. The command also resets the regulator parameter. The oscilloscope 402 then measures the diagnostic voltage waveform. Then, with the measurements still in progress, the user issues a single-syllable command which causes a type-1 output signal, which in the alternating-output mode comprises an output voltage that changes between +5 volts and zero upon each command. This voltage travels to the circuit under test 403 using the cable 408, thereby modulating the behavior of the circuit under test 403. Then, the user issues another double-syllable command, which causes the invention 401 to generate another type-2 pulse, which travels along the cable 407 to the circuit under test 403, again triggering the circuit under test 403 to initiate a behavior that is to be measured, but this time with the opposite voltage on cable 408. The oscilloscope 402 reveals any differences in the behavior of the circuit under test 403 under the two conditions modulated by the type-1 output signal, thereby accomplishing the desired measurement. The alternating type-1 signal could also be displayed on the oscilloscope 402 simultaneously, by adding another cable. Many other measurements and options are possible using the invention 401, depending on the outputs selected for various functions, the output mode and timing selected, and the command sequence employed.

Figure 5:
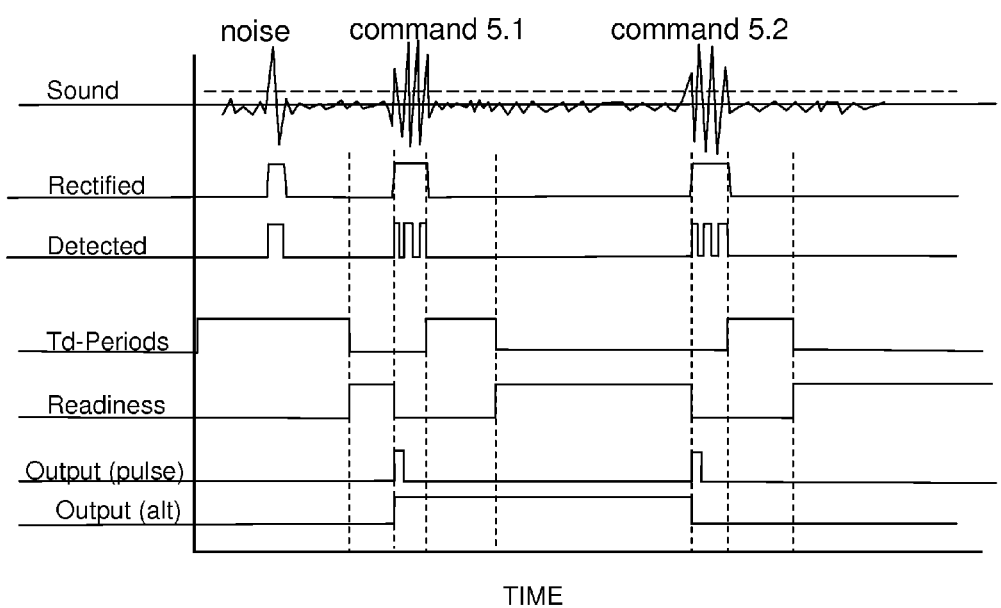
FIG. 5 is a chart showing the sound and pulse waveforms for single-syllable commands and single-pulse outputs.

FIG. 5 shows a time chart of the various signals and pulses. This chart applies to an embodiment that treats all commands as single-syllable commands, and then generates either a pulse or alternating output signal. Any additional syllables are ignored. The immediate timing mode is assumed. The first trace, labeled Sound, shows the amplified sound signals as a function of time. A noise pulse and two command sounds are shown. The horizontal dashed line shows the threshold. The vertical dotted lines show synchrony.

The second trace, labeled Rectified, shows the amplified signals following optional rectification and smoothing. This improves the noise rejection in certain environments, but places additional requirements on the user to emphasize vowel sounds clearly. The inventive method may detect sounds by comparing either the rectified or unrectified signals to a threshold.

The third trace in FIG. 5, labeled Detected, shows schematically when the amplified signal exceeds the threshold. The noise pulse and the two command sounds are detected. Optionally, the rectified signals could have been compared to a threshold, with essentially the same result.

The fourth trace, labeled Td-Periods, shows the deadtime intervals when the system waits for prior sounds to die down before accepting commands. During the Td period, if any sound is detected before the Td period expires, then the Td period is started over, and continues until a full Td interval passes with no further detected sound. This is illustrated when the noise pulse occurs. Since the noise pulse occurs before the Td period is finished, the noise causes Td to retrigger (start over) and then continue for a full Td period after the end of the noise pulse.

The fifth trace shows the readiness output signal, which indicates when the system is ready to receive a voice command. Initially, the system is inhibited due to the deadtime period, and the readiness signal is therefore low. Then, following the noise, plus the Td period, the deadtime requirement is finally satisfied, and the system becomes ready to receive commands. Thus the readiness signal goes high when Td expires with no further sound detected. Then, as soon as the first sound of command 5.1 is detected, the readiness signal immediately goes low again, thereby indicating that command processing is in progress. Readiness then stays low until the end of the command processing, plus another Td period. In this way the system prevents double-pulsing, and also informs the user when the invention can receive voice commands with a visual readiness indicator.

The sixth and seventh traces, labeled Output (pulse) and Output (alt), show the output signals for the pulse output mode and alternating output mode of operation respectively. No output signal is shown for the noise pulse because the readiness is low at that time, since the initial Td period has not yet completed. Therefore the noise pulse is ignored. At each command sound, on the other hand, the deadtime has finished and the readiness signal is high. Therefore the system recognizes both commands and produces a type-1 output signal upon each command sound. The output signal is a brief output pulse (in pulse mode) or an alternating voltage level (in alternating mode) responsive to each command.

Figure 6:
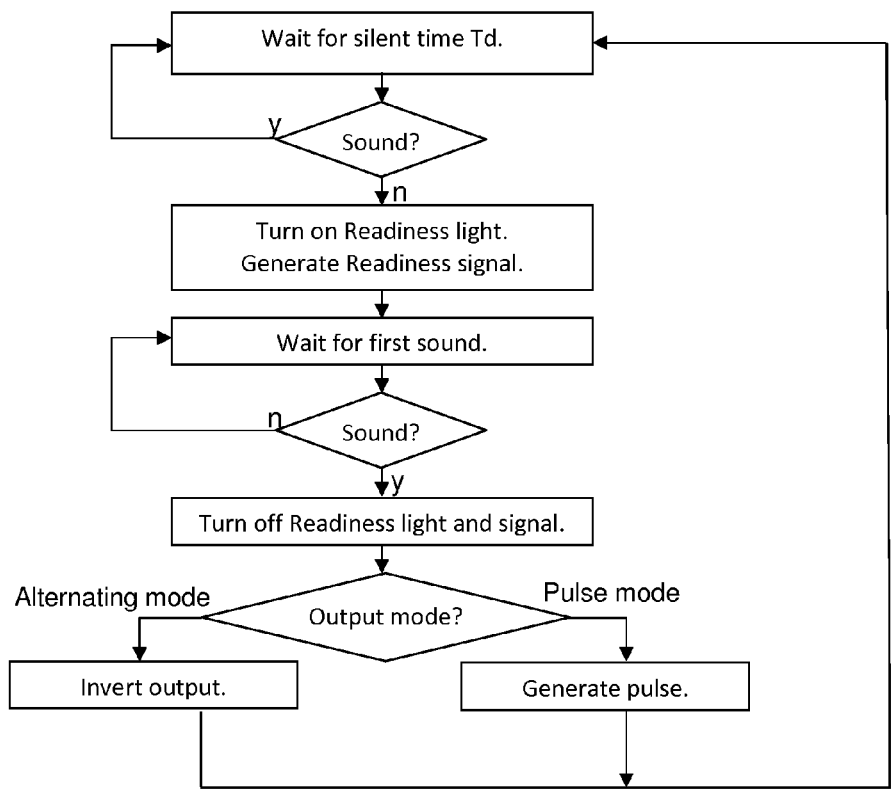
FIG. 6 is a flowchart showing the inventive method for single-syllable commands and various output modes.

FIG. 6 is a flowchart showing the inventive method for single-syllable commands, with output signals being either a pulse or an alternating voltage. First, the invention waits for a time of duration Td without detectable sound. It does this by repeatedly re-starting the Td period whenever a sound is detected, as indicated by the interrogator labeled "Sound?". When the Td period expires with no further sound being detected, the readiness indicator is illuminated and the readiness output signal is generated, thus showing that the invention is ready to receive a voice command.

Then, the invention waits until the first sound is detected, which is interpreted as a command sound. The readiness indicator and readiness output are then turned off and the output signal is generated. Depending on the output mode, the output signal is either a pulse output or an alternating voltage level. Then the cycle resumes by again waiting for a Td deadtime period.

The method illustrated in FIG. 6 is suitable for a relatively simple set-up in which the invention generates just one type of pulse, which is used to trigger a scope or activate a circuit upon voice command.

Figure 7:
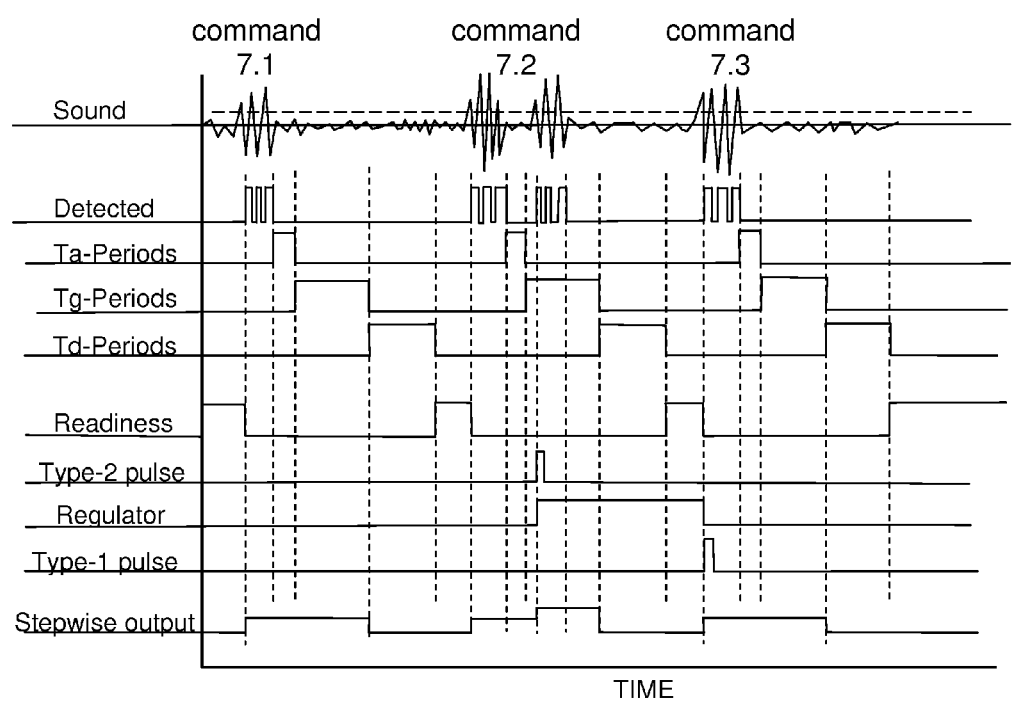
FIG. 7 shows the sound and pulse waveforms for a variety of commands.

FIG. 7 shows the sequence of sounds and pulses for a more versatile embodiment recognizing both one-syllable and two-syllable commands, in regulated mode, with pulse outputs. The top trace labeled Sound shows a single-syllable command labeled 7.1, a double-syllable command labeled 7.2, and then another single-syllable command 7.3. The trace labeled Detected shows when the sound exceeds the threshold. Td-Periods shows the deadtime intervals (in this case, a post-deadtime following each detected sound). Ta-Periods shows the short Ta period marking the end of the first syllable in each command. If any sound occurs while Ta is being measured, then the Ta clock is started over, and continuing until no further sound is detected, thereby marking the end of the first command syllable.

After the Ta period, a Tg period is marked to detect a second syllable, if any. If a sound occurs in Tg, then the command has two syllables. If no sound is detected in Tg, then the command has only one syllable. Accordingly, commands 7.1 and 7.3 have no additional sound in their respective Tg periods, and thus register as single-syllable commands, whereas command 7.2 shows the sound of the second syllable being detected in Tg. In this way the method determines whether a command is a single-syllable or double-syllable command.

Following each Tg period is a deadtime interval Td as shown in the Td-Periods trace. The next trace shows the readiness parameter, which starts out ready, but becomes not-ready (low) as soon as the first command sound is detected. Readiness stays low while the command is being processed, until after the subsequent deadtime, and only then returns to the high or ready state. The same pattern is repeated for each command; readiness goes low upon the first sound of the command and remains low until after the various command processing intervals plus a Td interval.

The next trace shows a type-2 output pulse, responsive to the double-syllable command 7.2. The pulse occurs immediately when the second sound of the command is detected. In the regulated-output mode, the output signal is generated immediately upon the sound of the syllable corresponding to the expected command, rather than waiting until the end of Tg.

The Regulator trace shows the regulator parameter which regulates the production of type-1 signals. Initially, the parameter is low, meaning type-1 signals are inhibited. Accordingly, the command 7.1 produced no outputs, despite being correctly detected while readiness was high. But since the regulator parameter was still low at that point, the single-syllable command 7.1 was ignored.

As soon as the double-syllable command 7.2 is recognized, the regulator parameter goes high, thereby re-enabling single-syllable commands. Regulator remains high until the next sound, which is the single-syllable command 7.3. A type-1 output is then generated because the regulator parameter is enabling when command 7.3 is received. Then, the regulator goes low to inhibit any subsequent type-1 outputs. This illustrates that in regulated-output mode, type-1 outputs are inhibited until being reset by a double-syllable command.

After the command 7.3, the sequence of Ta-Tg-Td is repeated as usual. Then, readiness goes high since the system is ready to receive another command, but the regulator is still low because the last command was a type-1. In the regulated-output mode, only one type-1 output is allowed after each double-syllable command, and any further single-syllable command responses are inhibited until being reset by another double-syllable command. Accordingly, if the command 7.3 had in fact been a type-2, then the regulator would have gone high as soon as a second-syllable sound was detected in the last Tg period. But since 7.3 was only a single-syllable command, the regulator stays low.

The last trace, labeled Stepwise output, shows an alternate output signal comprising a first voltage level upon the first syllable of any command, followed by a second voltage level if there is a second syllable, and so forth. After the Tg period expires, the command is finished, and the voltage returns to ground. The stepwise output is useful for triggering multiple instruments or channels by setting different triggering levels for each channel.

Figure 8:
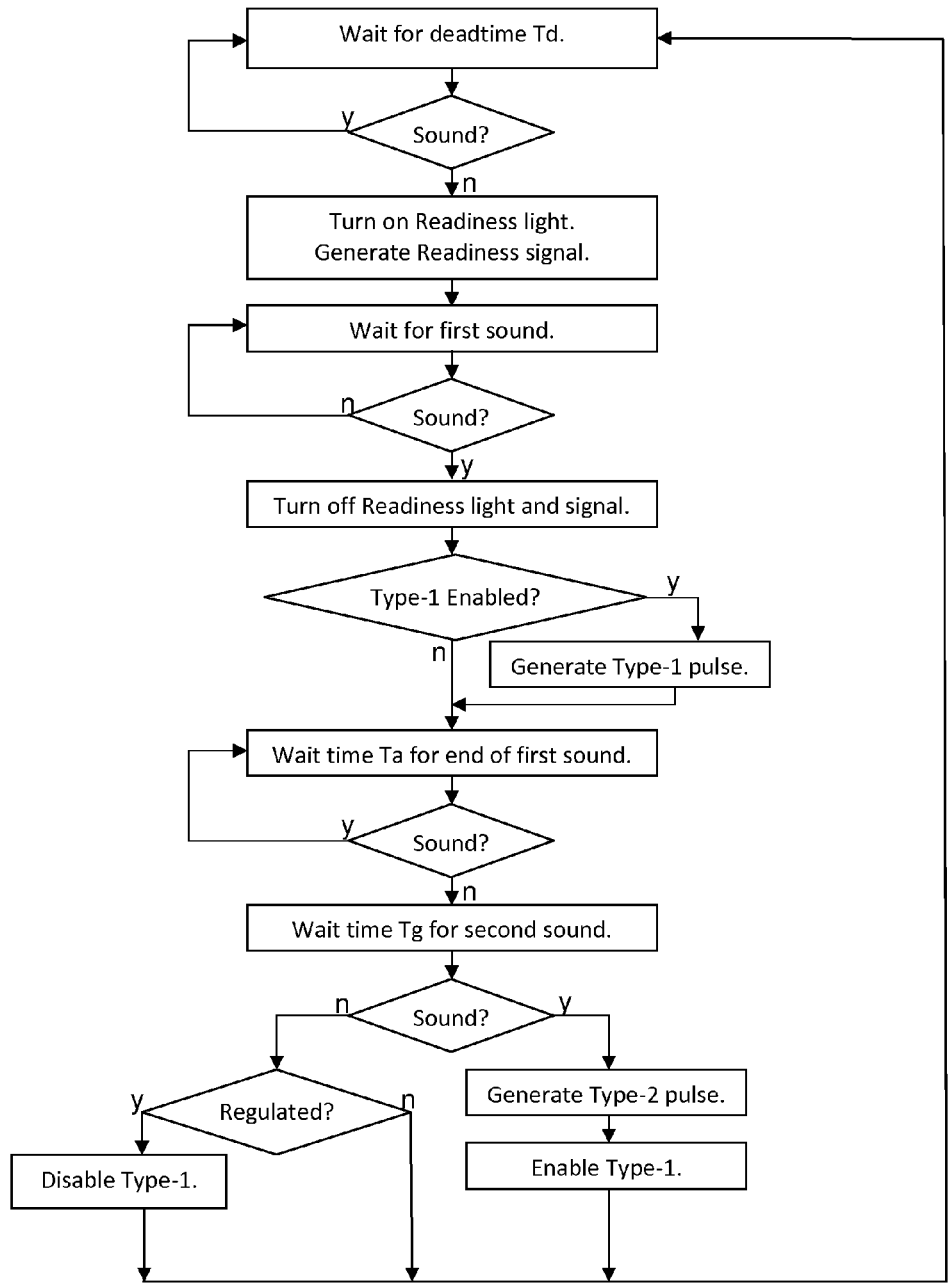
FIG. 8 is a flowchart showing the inventive method for multi-syllable commands.

FIG. 8 shows a flowchart corresponding to a method that accepts both single- and double-syllable commands, and generates a readiness output, and generates pulse outputs. Both the immediate and regulated output options are included as options. In the regulated-output mode, the regulator parameter is disabled after each type-1 and re-enabled after each type-2. In the immediate-output mode, on the other hand, the regulator parameter is always enabled, so the first sound always generates the type-1 pulse.

The flowchart of FIG. 8 starts with a Td deadtime, then turns on the readiness indicator and readiness output, then waits for a command. Upon the first sound, it immediately turns off the readiness indicator and readiness output. It also generates a type-1 output if the regulator parameter is set to enable type-1 outputs. But if the regulator parameter is still disabling when the command is detected, then the command is ignored and no type-1 output is generated.

Continuing with the flowchart, the end of the syllable is then found by waiting for a Ta interval with no sound. After that, a Tg interval is marked, and if any sound is detected during Tg, a type-2 output is generated and the regulator is set to enabling. However, if Tg expires with no further sound, then the command was a single-syllable command. When a single-syllable command is recognized, the regulator is set to disabling if the regulated-output mode has been selected. But if the regulated-output mode has not been selected (ie, the immediate-output mode has been selected), then the regulator parameter remains enabled. The method then goes back to the deadtime step and repeats.

Thus in the regulated-output mode, a single-syllable command produces a type-1 output only if the regulator parameter is enabling, and then sets it to disabling; while a type-2 command resets it back to enabling. In the immediate-output mode, the parameter always remains enabling, so the first syllable of every command generates a type-1 output.

As a slight alternative, the regulator parameter could be turned off as soon as the type-1 output is generated, as was illustrated in FIG. 7. Operationally, it makes no difference whether parameter is set at the beginning or end of the Tg period.

A three-syllable command generating a type-3 output would be processed in much the same way, except that the Ta-Tg sequence would be repeated twice for each command, thereby detecting all three syllable sounds as well as the two intervening gaps.

The embodiments and examples provided herein illustrate the principles of the invention and its practical application, thereby enabling one of ordinary skill in the art to best utilize the invention. Many other variations and modifications and other uses will become apparent to those skilled in the art, without departing from the scope of the invention, which is to be defined by the appended claims.

The invention claimed is:

1. A device to generate an output signal to activate a triggerable electronic system responsive to a spoken command, said device comprising:

a microphone and an amplifier configured to convert sound waves of the spoken command into amplified signals;

a processor configured to generate the output signal when the amplified signals exceed a threshold level;

and a connector carrying the output signal detachably connected to the electronic system;

wherein the processor is further configured to generate a type-1 output signal responsive to a single-sound command having only one voiced period, and to generate a type-2 output signal distinct from the type-1 output signal responsive to a double-sound command having two voiced periods separated by an interval of substantially less sound;

and wherein the processor is further configured to set a regulator parameter to an enabling state and a disabling state;

and wherein the processor is further configured, if the regulator parameter is in the enabling state, to immediately generate the type-1 output signal and set the regulator parameter to the disabling state, responsive to any command sound;

and wherein the processor is further configured, if the regulator parameter is in the disabling state, to generate no output signals and to leave the regulator parameter in the disabling state, responsive to a single-sound command;

and wherein the processor is further configured to generate the type-2 output signal and set the regulator parameter to the enabling state, responsive to a double-sound command;

thereby activating the triggerable electronic system responsive to the spoken command while ensuring that the type-1 output signal is generated immediately upon the first sound following a double-sound command, and that any subsequent single-sound commands will be ignored until another double-sound command is detected.

2. The device of claim 1 wherein the triggerable electronic system comprises a measurement instrument that, when activated by the output signal, measures one or more diagnostic voltages on a circuit under test.

3. The device of claim 1 wherein the triggerable electronic system comprises a circuit under test that, when activated by the output signal, generates one or more diagnostic voltages that are measured by a measurement instrument.

4. The device of claim 1 wherein the output signal comprises one of:
an electronic pulse of fixed amplitude and duration;
a voltage level that alternates between two fixed voltage values upon each voice command;
a voltage level that depends on how many syllables comprise the spoken command;
a waveform whose amplitude or frequency depends on how many syllables comprise the spoken command;
or a digital communication message.

5. The device of claim 1 which further includes a readiness output connector, and wherein:
the processor is further configured to generate a readiness output signal on the readiness output connector;
the readiness output signal comprises a first voltage level while the device is ready to respond to voice commands;
and the readiness output signal comprises a second voltage level distinct from the first voltage level while the device is inhibited from responding to voice commands.

6. The device of claim 1 which further includes at least one visual indicator that indicates an operational parameter of the device, the indicator being in the list of:
an indicator indicating when the device is ready to respond to a voice command;
an indicator indicating when the device is inhibited from responding to voice commands;
an indicator indicating when the device generates the output signal;
and an indicator indicating when a battery voltage is below a predetermined value.

7. The device of claim 1 which further includes a wearable speaker which is detachably connected to the processor, and wherein the processor, cooperating with the speaker, produces an audible sound when the output signal is generated.

8. The device of claim 1 wherein the processor is further configured to generate a type-3 output signal, distinct from the type-1 and type-2 output signals, responsive to a triple-sound command having three voiced periods separated by intervals of substantially less sound.

9. A method for activating an electronic system responsive to a spoken command, said method including a regulator parameter that has an enabling state and a disabling state, said method comprising the steps:
converting sound waves to raw electronic signals, and amplifying the raw signals to make amplified signals;
comparing the amplified signals to a predetermined threshold value, a spoken command sound being detected when the amplified signals exceed the threshold value;
then, waiting until a first command sound is detected;
then, waiting until a period Ta expires with no further sound detected therein, thereby determining that the first sound period of the command has finished;
then, waiting for a second command sound during a period Tg;
then, if no further sound is detected during Tg, determining that the command is a single-sound command, and if any sound is detected during Tg, determining that the command is a double-sound command;
then, responsive to a single-sound command, generating an electronic output signal comprising a type-1 output signal if the regulator parameter is in the enabling state, and inhibiting all type-1 output signals if the regulator parameter is in the disabling state;
and responsive to a double-sound command, generating a type-2 output signal distinct from the type-1 signal, and setting the regulator parameter to the disabling state;
and then, conveying the output signal to the electronic system, thereby activating the electronic system.

10. The method of claim 9 which further includes generating a readiness signal that indicates whether voice commands can be received, including the steps:
setting the readiness signal to indicate that voice commands can not be received;
then, while rejecting all voice commands, waiting until a deadtime period Td expires with no further sound detected therein;
then, setting the readiness signal to indicate that voice commands can be received;
then, waiting until a sound is detected exceeding the threshold value;
then, generating the output signal.

11. The method of claim 9 which further includes a delayed-output mode wherein the type-1 or type-2 output signal is generated only after the period Tg is finished.

12. The method of claim 9 which further includes an immediate-output mode wherein the type-1 output signal is generated immediately when the first sound of a command is detected, and the type-2 output signal is generated immediately when any sound is detected during the Tg period.

* * * * *